(12) United States Patent
Aoki et al.

(10) Patent No.: US 7,514,343 B2
(45) Date of Patent: Apr. 7, 2009

(54) METHOD FOR MANUFACTURING SIMOX WAFER AND SIMOX WAFER

(75) Inventors: Yoshiro Aoki, Tokyo (JP); Yukio Komatsu, Tokyo (JP); Tetsuya Nakai, Tokyo (JP); Seiichi Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 96 days.

(21) Appl. No.: 11/450,562

(22) Filed: Jun. 8, 2006

(65) Prior Publication Data

US 2006/0281233 A1    Dec. 14, 2006

(30) Foreign Application Priority Data

Jun. 13, 2005    (JP)    ............................. 2005-172715

(51) Int. Cl.
*H01L 21/425*    (2006.01)
(52) U.S. Cl. ........................ 438/526; 438/403; 438/423; 438/514; 438/530; 257/E21.135; 257/E21.563
(58) Field of Classification Search ................ 438/403, 438/423, 480, 764, 914; 257/E21.147, E21.247, 257/E21.315, E21.491
See application file for complete search history.

(56) References Cited

U.S. PATENT DOCUMENTS

| | | | |
|---|---|---|---|
| 5,534,446 | A | 7/1996 | Tachimori et al. |
| 5,658,809 | A | 8/1997 | Nakashima et al. |
| 5,918,136 | A | 6/1999 | Nakashima et al. |
| 5,930,643 | A | 7/1999 | Sadana et al. |

(Continued)

FOREIGN PATENT DOCUMENTS

JP    H07-263538    10/1995

OTHER PUBLICATIONS

Nan-Xiang Chen et al., "Effect of Annealing on the SOI Structure Formed by Large Dose Oxygen Implantation." *Extended Abstracts of the 20th International Conference on Solid State Devices and Materials*, Aug. 24-26, 1988, pp. 177-179.

(Continued)

*Primary Examiner*—Walter L Lindsay, Jr.
*Assistant Examiner*—Cheung Lee
(74) *Attorney, Agent, or Firm*—Kolisch Hartwell, PC

(57) ABSTRACT

This method for manufacturing a SIMOX wafer includes: heating a silicon wafer to 300° C. or more and implanting oxygen ions so as to form a high oxygen concentration layer within the silicon wafer; subjecting the silicon wafer to a cooling to less than 300° C. and an implanting of oxygen ions so as to form an amorphous layer; and subjecting the silicon wafer to a heat-treating in a mixed gas atmosphere containing oxygen so as to form a buried oxide layer. In the forming of the buried oxide layer, a starting temperature is less than 1350° C. and a maximum temperature is 1350° C. or more. This SIMOX wafer is manufactured by the above method and includes a BOX layer and a SOI layer on the BOX layer. The BOX layer has a thickness of 1300 Å or more and a breakdown voltage of 7 MV/cm or more, and the surface of the SOI layer and the interface between the SOI layer and the BOX layer have a roughness over a 10-μm square area of 4 Å rms or less.

1 Claim, 1 Drawing Sheet

U.S. PATENT DOCUMENTS 6,043,166 A     3/2000    Roitman et al.
6,090,689 A     7/2000    Sadana et al.

OTHER PUBLICATIONS

Yasuo Kunii, et al., "Reduction in Surface Roughness of SIMOX Substrate by $H_2$ Annealing." *Proceedings 1996 IEEE International SOI Conference*, Oct. 1996, pp. 42-43.

European Search Report for European Application No. EP06011986 dated Sep. 18, 2006.

Letter dated Oct. 2, 2006 from Kraus Weisert to Shiga International Patent Office attaching European Search Report for European Application No. EP06011986.

S. Nakashima, et al., "Thickness Increment of Buried Oxide in a SIMOX Wafer by High-Temperature Oxidation," *Proceedings 1994 IEEE International SOI Conference* (Oct. 1994), p. 71-72.

METHOD FOR MANUFACTURING SIMOX WAFER AND SIMOX WAFER

BACKGROUND OF THE INVENTION

1. Field of the Invention

The present invention relates to a method for manufacturing SIMOX (Separation by Implanted Oxygen) wafers and also to a SIMOX wafer. In particular, the present invention relates to a method for manufacturing SIMOX wafers by a modified low dose (MLD) process.

This application claims priority from Japanese Patent Application No. 2005-172715 filed on Jun. 13, 2005, the content of which is incorporated herein by reference.

2. Background Art

The SIMOX process is known as one of methods for manufacturing silicon-on-insulator (SOI) wafers. In accordance with the process, a buried oxide (BOX) layer can be formed by the following: oxygen atoms are implanted into a wafer, for example, at an implantation energy of about 200 keV and at a dose amount of about $2 \times 10^{18}$ atoms/cm$^2$, and then a heat treatment is conducted at a high temperature. In this SIMOX process, since the dose amount and the implantation energy can be closely controlled, the BOX layer and a SOI layer can be uniformly formed at predetermined thicknesses.

Substrates obtained at a dose amount of at least $10^{18}$ atoms/cm$^2$ are called "high-dose SIMOX wafers," and substrates obtained at a dose amount of $4 \times 10^{17}$/cm$^2$ or less are called "low-dose SIMOX wafers." Compared to the case of manufacturing the high-dose SIMOX wafers, in the case of manufacturing the low-dose SIMOX wafers, there is less occurrence of threading dislocations and the amount of time for implanting oxygen ions can be shortened; thereby, high-quality and low-cost SOI substrates can be manufactured. However, as the dose amount is reduced, the thickness of the BOX layer becomes thinner. Therefore, there is a risk of lowering the reliability of the BOX layer.

In order to solve this problem, the ITOX (Internal Thermal Oxidation) process was developed (Patent Document 1 and Non-Patent Document 1). In accordance with this ITOX process, the thickness of the BOX layer can be increased by the following: a heat treatment by which the thickness becomes a theoretical film thickness calculated from the dose amount of oxygen ions, is conducted in an argon gas atmosphere having an oxygen concentration less than 1%, and then a heat treatment is conducted in an argon atmosphere having an oxygen concentration of 1% or more.

By adopting the ITOX process, it is possible to increase the thickness of the BOX layer, to reduce pinholes in the BOX layer, and to lower irregularities or roughness at the surface of the SOI layer (a silicon single crystal layer on the surface of a substrate) and at the interface between the SOI layer and the BOX layer. Therefore, the quality of the low-dose SIMOX wafers can be significantly improved. However, even in the low-dose SIMOX process in which this technology is adopted, due to the large dose amount of oxygen ions, the ion-implantation takes several hours per batch. Moreover, since the ITOX process (i.e., specific heat treatment steps) is needed, productivity is decreased. Therefore, there is a problem to increase production costs.

With regard to the method for manufacturing SIMOX wafers, a process in which oxygen ions are implanted in two separate stages has been disclosed (Patent Document 2). In this two-stage oxygen ion implantation, oxygen ions are implanted into a silicon wafer at a large dose amount while the silicon wafer is in a heated state, and then the silicon wafer is cooled to about room temperature and oxygen ions are again implanted. In the first oxygen ion implantation, since the silicon wafer is heated, the surface of the silicon wafer is kept in the form of a silicon single crystal. In the second oxygen ion implantation, since the silicon wafer is held at a low temperature, an amorphous layer is formed. Then, the silicon wafer thus obtained is subjected to an oxidation treatment at a temperature such as 1350° C. for a fixed length of time, thereby, a SOI structure is formed.

In this process, due to the heat treatment after the ion implantation, a high-density defect layer including polysilicon, twin crystal and stacking faults are formed from the amorphous layer. Since oxygen readily precipitates in a region in which this high-density defect layer is formed, it is possible to thicken the BOX layer up to about twice as thick as a theoretical film thickness anticipated from the dose amount of oxygen ions. Moreover, since the dose amount of oxygen ions can be reduced to a lower level than that in the ITOX process, productivity is improved and production costs can be reduced. SIMOX wafers manufactured by this process are referred to as MLD-SIMOX, which stands for "modified low dose SIMOX".

Meanwhile, in the above steps or some other manufacturing steps, defects may be formed in the surface of the silicon substrate and particles such as dust or the like may adhere to the surface of the SOI wafer. If the SOI wafer is used in subsequent steps while remaining in such an undesirable state, there is a risk of decreasing the production yield of devices fabricated from the SOI wafer. Hence, the SOI wafer is subjected to an inspection to detect particles. For example, the surface of the substrate is cleaned and dried, and then, the inspection of the SOI wafer is typically carried out by exposing a light onto the surface of the SOI wafer and using an apparatus such as a surface inspection system to detect particles.

In the above MLD-SIMOX wafer, when a BOX layer is formed, the roughness increases at the surface of the SOI layer and at the interface between the SOI layer and the BOX layer. This may make it impossible, in the above particle inspection, to distinguish between the roughness of the surface of the SOI layer and the particles.

Another problem is that, in the MLD-SIMOX wafer, when the dose amount of oxygen ions is increased in order to achieve a thicker BOX layer, the breakdown voltage of the BOX layer is lowered.

It is therefore an object of the present invention to suppress the increases in roughness at the surface of the SOI layer and at the interface between the SOI layer and the BOX layer and the decrease in breakdown voltage of the BOX layer that are associated with the thickening of the BOX layer in the MLD-SIMOX wafer.

(Patent Document 1) Japanese Patent Application, First Publication No. H07-263538

(Patent Document 2) U.S. Pat. No. 5,930,643

(Non-Patent Document 1) S. Nakashima, et al., "Thickness Increment of Buried Oxide in a SIMOX Wafer by High-Temperature Oxidation," Proceedings of 1994 IEEE International SOI Conference, p. 71 to 72 (1994)

SUMMARY OF THE INVENTION

To achieve this object, we have conducted extensive investigations on the heat treatment conditions in the oxidation atmosphere after the implantation of oxygen ions. As a result, we have discovered that a lower temperature of the heat treatment provides a thicker BOX layer, whereas a higher temperature of the heat treatment provides the BOX layer with a more improved breakdown voltage and lowers the roughness at the surface of the SOI layer and at the interface between the SOI layer and the BOX layer.

Accordingly, a method for manufacturing a SIMOX wafer of the present invention includes: while heating a silicon wafer to 300° C. or more, implanting oxygen ions so as to form a high oxygen concentration layer within the silicon wafer; subjecting the silicon wafer which is obtained by the forming of the high oxygen concentration layer to a cooling to less than 300° C. and an implanting of oxygen ions so as to form an amorphous layer in the silicon wafer; and subjecting the silicon wafer which is obtained by the forming of the amorphous layer to a heat-treating in a mixed gas atmosphere containing oxygen so as to form a buried oxide layer, wherein in the forming of the buried oxide layer, the heat-treating is conducted under conditions in which a starting temperature is less than 1350° C. and a maximum temperature is 1350° C. or more.

By heat-treating at a relatively low temperature below 1350° C. at the start of the heat treatment in this way, the BOX layer is made thicker. Subsequent heat treatment at a relatively high temperature of 1350° C. or more enables the breakdown voltage of the BOX layer to be enhanced and the roughness at the surface of the SOI layer and at the interface between the SOI layer and the BOX layer to be reduced.

In the method for manufacturing a SIMOX wafer of the present invention, in the forming of the buried oxide layer, the heat-treating may include heat-treating the silicon wafer at a constant temperature of less than 1350° C. By heat-treating (holding) the silicon wafer in a relatively low temperature region below 1350° C., oxygen that has been implanted into the wafer precipitates and grows as oxides. Therefore, the thickness of the BOX layer can be increased.

In the forming of the buried oxide layer, the heat treatment may include heat-treating the silicon wafer under conditions in which the temperature is raised linearly or in a stepwise manner from the starting temperature. For example, by suitably adjusting the temperature rise gradient in accordance with the selected temperature range, it is possible to more closely control the thickness of the BOX layer, the insulating properties such as the breakdown voltage, and the roughness at the interface.

The SIMOX wafer of the present invention is manufactured by the method for manufacturing a SIMOX wafer of the present invention, and the SIMOX wafer includes: a BOX layer; and a SOI layer on the BOX layer, wherein the BOX layer has a thickness of 1300 Å or more and a breakdown voltage of 7 MV/cm or more, and each of the surface of the SOI layer and the interface between the SOI layer and the BOX layer has a roughness over a 10-μm square area of 4 Å rms or less.

In accordance with the present invention, the increases in roughness at the surface of the SOI layer and at the interface between the SOI layer and the BOX layer can be suppressed and also the decrease in breakdown voltage of the BOX layer can be suppressed, which are associated with the thickening of the BOX layer in the MLD-SIMOX wafer.

BRIEF DESCRIPTION OF THE DRAWINGS

FIG. 1A shows a cross-section of the wafer after implantation of oxygen ions, and FIG. 1B shows a cross-section of the SIMOX wafer obtained after a heat treatment.

PREFERRED EMBODIMENTS

Embodiments of the method for manufacturing a MLD-SIMOX wafer (referred to below as "SIMOX wafer" where appropriate) of the present invention are described in detail below in conjunction with the attached diagrams.

Figure 1A:
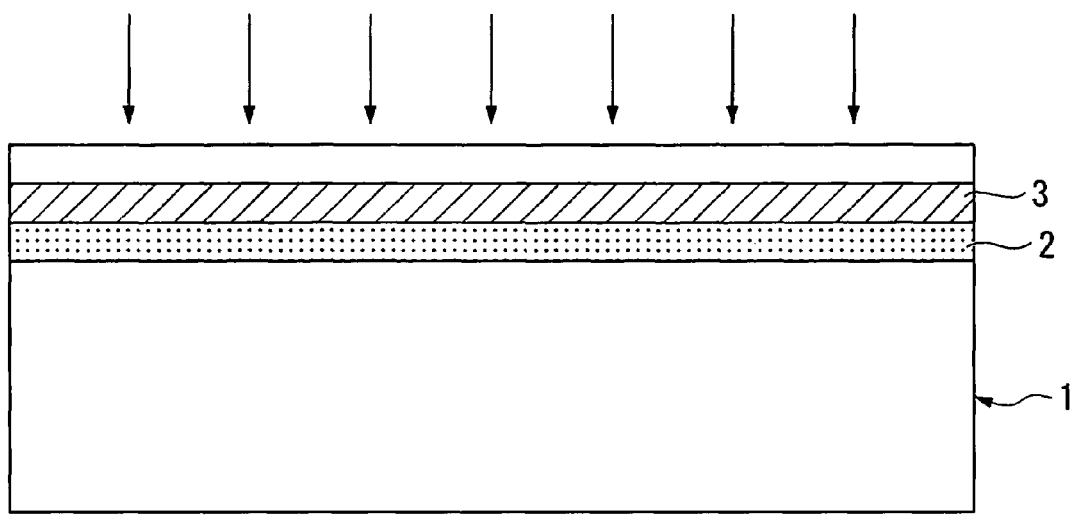
FIGS. 1A and 1B illustrate a method for manufacturing a SIMOX wafer by a MLD-SIMOX process in accordance with the present invention. In detail.
Figure 1B:
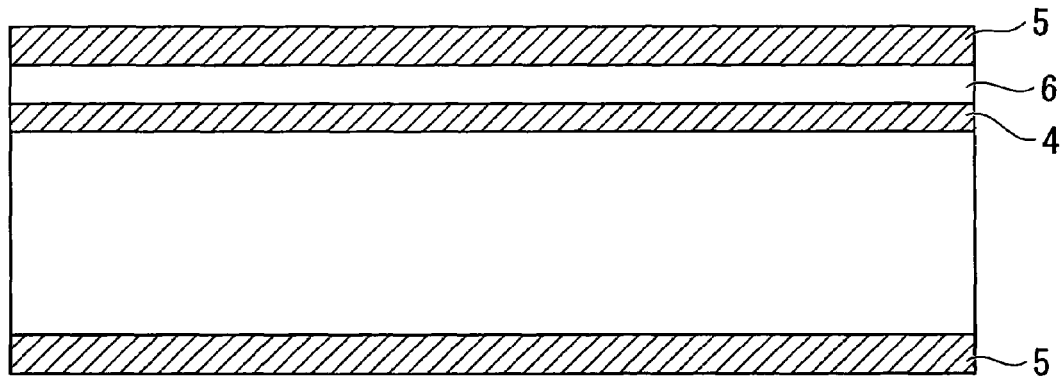

FIGS. 1A and 1B illustrate the method for manufacturing a SIMOX wafer by a MLD-SIMOX in accordance with the present invention.

The method for manufacturing a SIMOX wafer in accordance with this embodiment includes implanting oxygen ions into a silicon wafer 1 and heat-treating the silicon wafer (oxidation treatment). Implantation of oxygen ions is carried out in two stages. The first implantation of oxygen ions is carried out while the silicon wafer 1 is heated at 300° C. or more, and preferably from 300 to 600° C. In the first implantation of oxygen ions, a dose amount of oxygen ions is $2\times10^{16}$ to $4\times10^{17}$ atoms/cm$^2$, and preferably $3\times10^{16}$ to $3\times10^{17}$ atoms/cm$^2$, and an implantation energy (acceleration energy) is in a range of 140 to 220 keV, and preferably 180 keV. After the first oxygen ion implantation, a second oxygen ion implantation is carried out while the silicon wafer 1 is in a state of been cooled to, for example, a temperature close to room temperature. In the second implantation of oxygen ions, a dose amount of oxygen ions is $1\times10^{14}$ to $5\times10^{16}$ atoms/cm$^2$, and preferably $1\times10^{15}$ to $1\times10^{16}$ atoms/cm$^2$ and an implantation energy is in a range of 140 to 220 keV, and preferably 180 keV.

FIG. 1A shows a cross-section of the wafer after the implantation of oxygen ions. The arrows schematically represent implantation of the oxygen ions. In the first implantation of oxygen ions, the silicon wafer 1 is heated to a relatively high temperature so as to form a high oxygen concentration layer 2 while maintaining the surface of the silicon wafer 1 as a silicon single crystal. In the second implantation of oxygen ions, the temperature is set to a lower level than that in the first implantation of oxygen ions so as to form an amorphous layer 3.

FIG. 1B shows a cross-section of the SIMOX wafer obtained after the heat treatment. In the heat treatment, the silicon wafer is heat-treated in a mixed gas atmosphere having a specific ratio of oxygen gas to inert gas (e.g., an oxygen partial pressure ratio of at least 5%) for 10 to 20 hours, thereby forming a buried oxide (BOX) layer 4. In this embodiment, at first, a heat treatment is carried out at a temperature of less than 1350° C., preferably in a range of 1280 to 1320° C., for a predetermined length of time. Then, a further heat treatment is carried out at a higher temperature while the temperature is raised to a temperature range of 1350° C. or more and less than the melting point of silicon. Since a thickness of a surface oxide layer 5 is dependent on the oxygen partial pressure of the mixed gas and the heat treatment time, the thickness of the SOI layer (a silicon single crystal layer in the substrate surface) 6 can be controlled by adjusting the oxygen partial pressure and the heat treatment time. Nitrogen gas or argon gas is used as the inert gas which is mixed with the oxygen.

The heat treatment conditions are described in detail. Compared to the established heat treatment temperature conditions in accordance with the prior art, in this embodiment, the heat treatment is first carried out at a temperature of below 1350° C. which is relatively low. Thereby, oxygen precipitates are formed at a high density, and the BOX layer 4 is thickened. Next, the heat treatment is carried out at a relatively high temperature while the temperature is raised to 1350° C. or more. Thereby, the BOX layer 4 is modified such that the breakdown voltage is improved and the roughness is reduced at the surface of the SOI layer 6 and at the interface between the SOI layer 6 and the BOX layer 4.

In the heat treatment at the temperature of less than 1350° C., the wafer is heat-treated (held) at a constant starting temperature of the heat treatment, and the heat treatment (holding) time is adjusted as appropriate to allow oxygen precipitates to grow at a high density. Thereby, the thickness of the BOX layer can be controlled. Here, the starting temperature is defined as a temperature at which the mixed gas containing oxygen of 5% or more is introduced into a heat treatment furnace and the oxidation of the silicon wafer 1 starts. In this heat treatment at the temperature of less than 1350° C., the oxygen partial pressure ratio in the ambient gas atmosphere is in a range from 5% or more to 100% or less, and the heat treatment time is preferably in a range from 10 to 20 hours. When raising a temperature from a room temperature to the starting temperature, the oxygen partial pressure ratio in the ambient gas atmosphere is less than 5%.

When raising a temperature from a temperature range of less than 1350° C. to a temperature range of 1350° C. or more, the temperature may be raised linearly or in a stepwise manner. For example, by adjusting the temperature rise gradient in accordance with the selected temperature range, the thickness of the BOX layer, the insulating properties such as the breakdown voltage and the roughness at the interface can be more closely controlled. In this raising of the temperature, the oxygen partial pressure ratio in the ambient gas atmosphere is in a range from 5% or more to 100% or less, and the rate of temperature rise is preferably in a range from 0.05 to 0.5° C./min.

In the heat treatment at the temperature of 1350° C. or more, the wafer is held (heat-treated) at the temperature of 1350° C. or more for a predetermined length of time, thereby, the thicknesses of the surface oxide layer 5 and the SOI layer 6 can be controlled. Furthermore, the BOX layer 4 can be modified such that the breakdown voltage is enhanced and the roughness is reduced both at the surface of the SOI layer 6 and at the interface between the SOI layer 6 and the BOX layer 4. It is preferable for the oxygen partial pressure ratio in the mixed gas at this time to be less than 5%.

In the heat treatment at the temperature of 1350° C. or more, the heat treatment time is preferably in a range from 5 to 15 hours.

As described above, in the present embodiment, in the heat treatment after the implantation of oxygen ions, the starting temperature is set to less than 1350° C. in an atmosphere having an oxygen concentration of at least 5%, and then the temperature is raised to 1350° C. or more. Thereby, the BOX layer 4 of the SIMOX wafer can be made thicker, and it is possible to achieve an improvement in the breakdown voltage of the BOX layer 4 and reductions in the roughness at the surface of the SOI layer 6 and at the interface between the SOI layer 6 and the BOX layer 4.

EXAMPLES

The invention is illustrated more fully in the following examples and comparative examples.

Example 1

A first implantation of oxygen ions was carried out at a dose amount of oxygen ions of $2.6 \times 10^{17}$ atoms/cm$^2$ and an implantation energy of 170 keV while heating a wafer at 400° C. in a vacuum. Next, a second implantation of oxygen ions was carried out at a dose amount of oxygen ions of $6 \times 10^{15}$ atoms/cm$^2$ and an implantation energy of 160 keV. The resulting wafer was subjected to an oxidation treatment at 1310° C. in an argon gas atmosphere containing 50% oxygen gas for 5 hours, and then the wafer was subjected to a further oxidation treatment while raising the temperature at a rate of 0.10° C./min from 1310° C. to 1350° C. As a result, a thickness of a SOI layer became about 600 Å, and a thickness of a BOX layer became about 1400 Å. An MLD-SIMOX wafer having the thick BOX layer was manufactured. The roughness over an area of 10 μm square at the SOI surface, and the roughness over an area of 10 μm square at the interface between the SOI layer and the BOX layer were respectively 3.3 Å and 3.9 Å, and the BOX layer had a breakdown voltage of 7.1 MV/cm, all results were indicative of a high wafer quality.

Example 2

A first implantation of oxygen ions was carried out at a dose amount of oxygen ions of $2.5 \times 10^{17}$ atoms/cm$^2$ and an implantation energy of 170 keV while heating a wafer at 400° C. in a vacuum. Next, a second implantation of oxygen ions was carried out at a dose amount of oxygen ions of $6 \times 10^{15}$ atoms/cm$^2$ and an implantation energy of 160 keV. The resulting wafer was subjected to an oxidation treatment at 1300° C. in an argon gas atmosphere containing 50% oxygen gas for 5 hours, and then the wafer was subjected to a further oxidation treatment while raising the temperature at a rate of 0.12° C./min from 1300 to 1350° C. As a result, a thickness of a SOI layer became about 700 Å and a thickness of a BOX layer became about 1400 Å. An MLD-SIMOX wafer having the thick BOX layer was manufactured. The roughness over an area of 10 μm square at the SOI surface and the roughness over an area of 10 μm square at the interface between the SOI layer and the BOX layer were respectively 3.7 Å and 2.6 Å, and the BOX layer had a breakdown voltage of 7.3 MV/cm, all results were indicative of a high wafer quality.

Comparative Example 1

A first implantation of oxygen ions was carried out at a dose amount of oxygen ions of $3.0 \times 10^{17}$ atoms/cm$^2$ and an implantation energy of 175 keV while heating a wafer at 400° C. in a vacuum. Next, a second implantation of oxygen ions was carried out at a dose amount of oxygen ions of $2 \times 10^{15}$ atoms/cm$^2$ and an implantation energy of 160 keV. The resulting wafer was subjected to an oxidation treatment at 1320° C. in an argon gas atmosphere containing 50% oxygen gas for 10 hours. As a result, a thickness of a SOI layer became about 600 Å and a thickness of a BOX layer became about 1500 Å. An MLD-SIMOX wafer having a thick BOX layer was manufactured. However, the roughness over an area of 10 μm square at the SOI surface and the roughness over an area of 10 μm square at the interface between the SOI layer and the BOX layer were respectively 6.0 Å and 6.7 Å, and the BOX layer had a breakdown voltage of 5.1 MV/cm. These results were indicative of an inadequate wafer quality.

Comparative Example 2

A wafer that had been subjected to implantation of oxygen ions under the same conditions as in Comparative Example 1 was then subjected to an oxidation treatment at 1350° C. in an argon gas atmosphere containing 50% oxygen gas for 8 hours 35 minutes. Since the temperature of the oxidation treatment was set to a higher temperature than that in Comparative Example 1, the oxidation time was shortened so as to bring the thickness of the SOI layer to about 600 Å which was same as in Comparative Example 1. As a result, both of the roughness over an area of 10 μm square at the SOI surface and the roughness over an area of 10 μm square at the interface between the SOI layer and the BOX layer decreased to 4.0 Å, and the breakdown voltage of the BOX layer improved to 5.7 MV/cm. However, the thickness of the BOX layer decreased to about 1200 Å.

As is apparent from the above examples of the present invention and the comparative examples, because the manufacturing processes in Examples 1 and 2 was conducted under heat treatment conditions in accordance with the present invention, there can be obtained high-quality MLD-SIMOX wafers which have a BOX layer thickness of at least 1300 Å, a breakdown voltage of at least 7 MV/cm, and roughness at the SOI surface and at the interface between the SOI layer and the BOX layer of 4 Å rms or less.

Some preferred embodiments of the invention have been described above, although these embodiments are to be considered in all respects as illustrative and not limitative. Those skilled in the art will appreciate that various additions, omissions, substitutions and other modifications are possible without departing from the spirit and scope of the invention as disclosed in the accompanying claims.

What is claimed is:

1. A method for manufacturing a SIMOX wafer, comprising:

while heating a silicon wafer to 300° C. or more, implanting oxygen ions so as to form a high oxygen concentration layer within the silicon wafer;

subjecting the silicon wafer which is obtained by the forming of the high oxygen concentration layer to a cooling to less than 300° C. and an implantation of oxygen ions so as to form an amorphous layer in the silicon wafer; and subjecting the silicon wafer which is obtained by the forming of the amorphous layer to a heat treatment in a mixed gas atmosphere containing oxygen so as to form a buried oxide layer, wherein in the forming of the buried oxide layer the heat treatment comprises:

heat-treating the silicon wafer at an oxygen partial pressure ratio of 5% or more and 100% or less at a constant temperature of less than 1350° C.; and thereafter, heat-treating the silicon wafer under conditions in which the temperature is raised linearly or in a stepwise manner from the constant temperature to a temperature of 1350° C. or more and less than the melting point of silicon at a rate of temperature rise of 0.05 to 0.5° C./min.

* * * * *